US012805113B2

(12) United States Patent
Qu

(10) Patent No.: US 12,805,113 B2
(45) Date of Patent: Nov. 17, 2026

(54) DISPLAY DEVICE, AND METHOD FOR MANUFACTURING DISPLAY DEVICE

(71) Applicant: Sharp Display Technology Corporation, Kameyama City (JP)

(72) Inventor: Yang Qu, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 353 days.

(21) Appl. No.: 18/294,483

(22) PCT Filed: Oct. 11, 2021

(86) PCT No.: PCT/JP2021/037538

§ 371 (c)(1),
(2) Date: Feb. 1, 2024

(87) PCT Pub. No.: WO2023/062672

PCT Pub. Date: Apr. 20, 2023

(65) Prior Publication Data

US 2024/0357847 A1 Oct. 24, 2024

(51) Int. Cl.
*H10K 50/115* (2023.01)
*H10K 50/15* (2023.01)
*H10K 59/12* (2023.01)

(52) U.S. Cl.
CPC .......... *H10K 50/115* (2023.02); *H10K 50/15* (2023.02); *H10K 59/1201* (2023.02)

(58) Field of Classification Search
None
See application file for complete search history.

(56) References Cited

U.S. PATENT DOCUMENTS

2018/0033984 A1 2/2018 Luchinger et al.
2023/0071128 A1 3/2023 Qu
2023/0337447 A1* 10/2023 Mei .................... H10K 50/166

FOREIGN PATENT DOCUMENTS

CN 108529690 A 9/2018
JP 2018-506857 A 3/2018
WO 2021/156999 A1 8/2021

* cited by examiner

*Primary Examiner* — Michelle Mandala
(74) *Attorney, Agent, or Firm* — ScienBiziP, P.C.

(57) ABSTRACT

A light-emitting element includes an anode, a cathode, a light-emitting layer, and a hole injection layer, and the hole injection layer includes a nickel oxide nanoparticle and dimethyl sulfoxide that chemically modifies the nickel oxide nanoparticle.

7 Claims, 10 Drawing Sheets

DMSO: $H_2O$ MIXED SOLVENT (x %, x = 0 TO 100 %)

IN CASE OF HAVING REPELLENCY (AQUEOUS SOLUTION)

DISPLAY DEVICE, AND METHOD FOR MANUFACTURING DISPLAY DEVICE

TECHNICAL FIELD

The disclosure relates to a light-emitting element, a display device, and a method of manufacturing the display device.

BACKGROUND ART

In recent years, various display devices provided with light-emitting elements are developed. In particular, a display device provided with a quantum dot light-emitting diode (QLED), or an organic light-emitting diode (OLED) attracts a great deal of attention from perspectives such as the capability to achieve lower power consumption, a slimmer design, and higher picture quality.

In general, in the case of QLEDs or OLEDs, organic hole injection materials such as PEDOT:PSS are used as hole injection layers, and organic hole transport materials are used as hole transport layers. Such an organic hole injection material has a relatively high hole injection capability, and such an organic hole transport material has a relatively high hole transport capability, but there is a problem in reliability because both materials are organic materials.

For this reason, studies on inorganic hole injection materials or inorganic hole transport materials that can be used as hole injection layers or hole transport layers of QLEDs or OLEDs are actively conducted.

For example, PTL 1 discloses a light-emitting element including a hole injection layer (HIL) formed of a composition in which metal oxide nanoparticles such as NiO are dispersed in a dimethyl sulfoxide (DMSO) polar solvent or the hole injection layer also serving as a hole transfer layer (HTL).

CITATION LIST

Patent Literature

PTL 1: JP 2018-506857 T

SUMMARY

Technical Problem

However, although the reliability of the light-emitting element disclosed in PTL 1 is improved because the hole injection layer is formed of an inorganic material, the light-emitting element has a problem of low luminous efficiency.

An object of one aspect of the disclosure is to provide a light-emitting element with high reliability and high luminous efficiency, a display device, and a method of manufacturing the display device.

Solution to Problem

In order to solve the above problem, a light-emitting element according to one aspect of the disclosure includes an anode, a cathode, a light-emitting layer provided between the anode and the cathode, and a hole injection layer provided between the anode and the light-emitting layer, and the hole injection layer includes a nickel oxide nanoparticle and dimethyl sulfoxide that chemically modifies the nickel oxide nanoparticle.

In order to solve the above problem, a display device according to one aspect of the disclosure includes a substrate, a thin film transistor layer provided on the substrate, and a plurality of the light-emitting elements according to the one aspect of the disclosure provided on the thin film transistor layer, the plurality of the light-emitting elements include a first light-emitting element, a second light-emitting element, and a third light-emitting element, the first light-emitting element includes, as the light-emitting layer, a first light-emitting layer, the second light-emitting element includes, as the light-emitting layer, a second light-emitting layer having a light-emission peak wavelength different from a light-emission peak wavelength of the first light-emitting layer, and the third light-emitting element includes, as the light-emitting layer, a third light-emitting layer having a light-emission peak wavelength different from the light-emission peak wavelengths of the first light-emitting layer and the second light-emitting layer.

In order to solve the above problem, a method of manufacturing a display device according to one aspect of the disclosure includes forming a thin film transistor layer on a substrate, and forming a light-emitting element on the thin film transistor layer, the light-emitting element including an anode, a cathode, and a light-emitting layer provided between the anode and the cathode, and the forming a light-emitting element further includes forming a hole injection layer including a nickel oxide nanoparticle and dimethyl sulfoxide that chemically modifies the nickel oxide nanoparticle between the anode and the light-emitting layer.

Advantageous Effects of Disclosure

According to one aspect of the disclosure, it is possible to provide a light-emitting element with high reliability and high luminous efficiency, a display device, and a method of manufacturing the display device.

DESCRIPTION OF EMBODIMENTS

A description follows regarding embodiments of the disclosure, with reference to FIG. 1 to FIG. 10. Hereinafter, for convenience of description, configurations having the same functions as those described in a specific embodiment are denoted by the same reference signs, and descriptions thereof will be omitted.

In the present specification, "nickel oxide nanoparticles" mean nickel oxide particles having particle diameters in nanometer order.

First Embodiment

Figure 1:
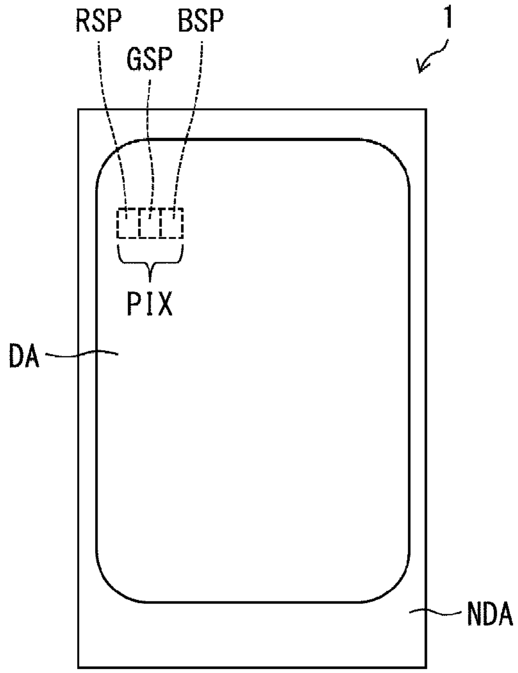
FIG. 1 is a plan view illustrating a schematic configuration of a display device according to a first embodiment.

FIG. 1 is a schematic plan view illustrating a configuration of a display device 1 according to a first embodiment.

As illustrated in FIG. 1, the display device 1 includes a frame region NDA and a display region DA. A plurality of pixels PIX are provided in the display region DA of the display device 1, and each pixel PIX includes a red subpixel RSP, a green subpixel GSP, and a blue subpixel BSP. In the present embodiment, a case will be described as an example in which one pixel PIX includes the red subpixel RSP, the green subpixel GSP, and the blue subpixel BSP, but no such limitation is intended. For example, one pixel PIX may further include a subpixel of another color in addition to the red subpixel RSP, the green subpixel GSP, and the blue subpixel BSP.

Figure 2:
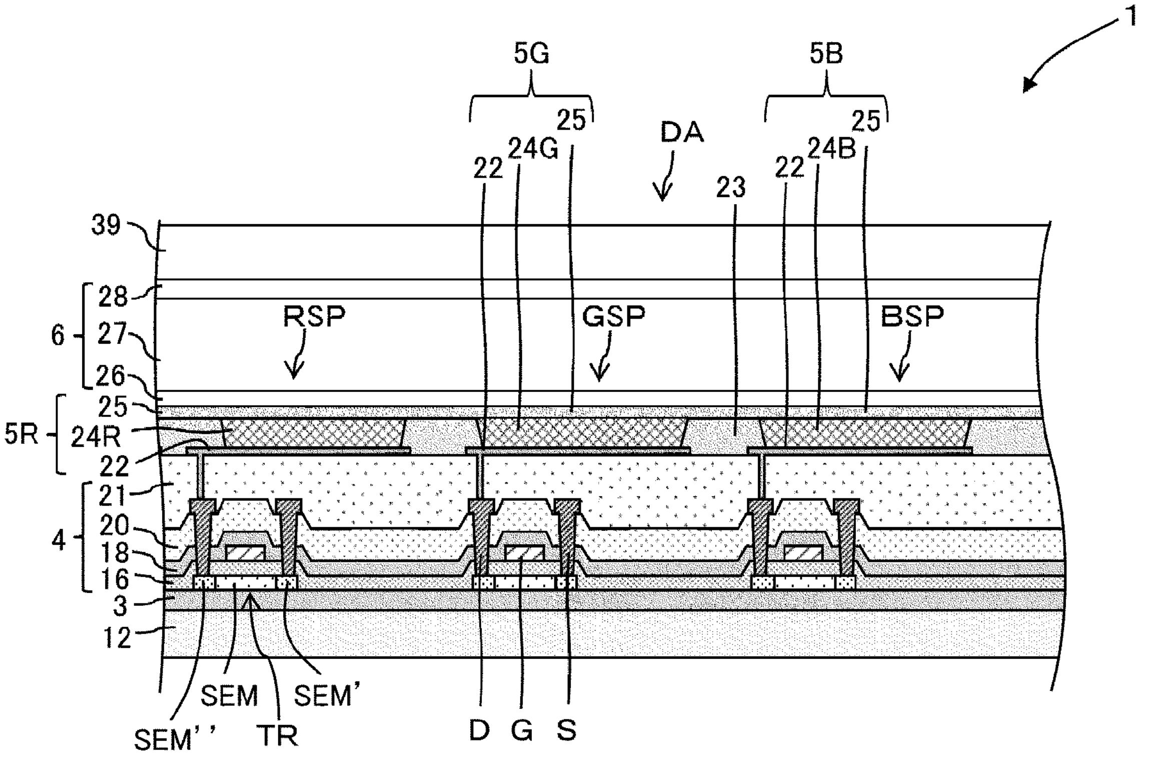
FIG. 2 is a cross-sectional view illustrating a schematic configuration of a display region of the display device according to the first embodiment.

FIG. 2 is a cross-sectional view illustrating a schematic configuration of the display region DA of the display device 1 according to the first embodiment.

As illustrated in FIG. 2, in the display region DA of the display device 1, a barrier layer 3, a thin film transistor layer 4 including transistors TRs, a red light-emitting element 5R, a green light-emitting element 5G, a blue light-emitting element 5B, and an edge cover (water-repellent bank) 23, a sealing layer 6, and a function film 39 are provided on a substrate 12 in this order from the substrate 12 side.

The red subpixel RSP provided in the display region DA of the display device 1 includes a red light-emitting element 5R (first light-emitting element), the green subpixel GSP provided in the display region DA of the display device 1 includes a green light-emitting element 5G (second light-emitting element), and the blue subpixel BSP provided in the display region DA of the display device 1 includes a blue light-emitting element 5B (third light-emitting element). The red light-emitting element 5R included in the red subpixel RSP includes an anode 22, a function layer 24R including a red light-emitting layer, and a cathode 25, the green light-emitting element 5G included in the green subpixel GSP includes an anode 22, a function layer 24G including a green light-emitting layer, and the cathode 25, and the blue light-emitting element 5B included in the blue subpixel BSP includes an anode 22, a function layer 24B including a blue light-emitting layer, and the cathode 25.

The substrate 12 may be, for example, a resin substrate made of a resin material such as polyimide, or may be a glass substrate. In the present embodiment, the display device 1 is a flexible display device, and thus a case will be described as an example in which the resin substrate made of the resin material such as polyimide is used as the substrate 12. However, no such limitation is intended. In a case where the display device 1 is a non-flexible display device, the glass substrate may be used as the substrate 12.

The barrier layer 3 is a layer that inhibits foreign matter, such as water and oxygen, from entering the transistor TR, the red light-emitting element 5R, the green light-emitting element 5G, and the blue light-emitting element 5B, and can be formed of, for example, a silicon oxide film, a silicon nitride film, or a silicon oxynitride film, or a layered film thereof formed by chemical vapor deposition (CVD).

The transistor TR portion of the thin film transistor layer 4 including the transistor TR includes a semiconductor film SEM, doped semiconductor films SEM' and SEM", an inorganic insulating film 16, a gate electrode G, an inorganic insulating film 18, an inorganic insulating film 20, a source electrode S, a drain electrode D, and a flattening film 21. A portion other than the transistor TR portion of the thin film transistor layer 4 including the transistor TR includes the inorganic insulating film 16, the inorganic insulating film 18, the inorganic insulating film 20, and the flattening film 21.

The semiconductor films SEM, SEM' and SEM" may be formed of low-temperature polysilicon (LTPS) or an oxide semiconductor (for example, an In—Ga—Zn—O based semiconductor), for example. In the example of the present embodiment described herein, the transistor TR has a top gate structure. However, no such limitation is intended, and the transistor TR may have a bottom gate structure.

The gate electrode G, the source electrode S, and the drain electrode D may be formed of a single-layer film or a layered film of a metal including, for example, at least one of aluminum, tungsten, molybdenum, tantalum, chromium, titanium, or copper.

The inorganic insulating film 16, the inorganic insulating film 18, and the inorganic insulating film 20 may be formed of a silicon oxide film, a silicon nitride film, or a silicon oxynitride film, or a layered film thereof, formed by CVD.

The flattening film 21 may be formed of coatable organic materials such as polyimide and acrylic.

The red light-emitting element 5R includes the anode 22 that is an upper layer overlying the flattening film 21, the function layer 24R including the red light-emitting layer, and the cathode 25. The green light-emitting element 5G includes the anode 22 that is an upper layer overlying the flattening film 21, the function layer 24G including the green light-emitting layer, and the cathode 25. The blue light-emitting element 5B includes the anode 22 that is an upper layer overlying the flattening film 21, the function layer 24B including the blue light-emitting layer, and the cathode 25. Note that the edge cover 23 with insulating properties covering the edge of the anode 22 is formed, for example, by applying an organic material, such as polyimide or acrylic, and then patterning the organic material by photolithography.

In the present embodiment, a case will be described as an example where the red light-emitting element 5R, the green light-emitting element 5G, and the blue light-emitting element 5B are QLEDs (quantum dot light-emitting diodes), but no such limitation is intended. The red light-emitting element 5R, the green light-emitting element 5G, and the blue light-emitting element 5B may be OLEDs (organic light-emitting diodes), or one or some elements of the red light-emitting element 5R, the green light-emitting element 5G, and the blue light-emitting element 5B may be QLEDs, and the remaining element or elements of the red light-emitting element 5R, the green light-emitting element 5G, and the blue light-emitting element 5B may be OLEDs. Note that when the red light-emitting element 5R, the green light-emitting element 5G, and the blue light-emitting element 5B are QLEDs, the light-emitting layer included in each of the light-emitting elements with the respective colors is a light-emitting layer including a quantum dot formed by, for example, a coating method or an ink-jet method. When each of the red light-emitting element 5R, the green light-emitting element 5G, and the blue light-emitting element 5B is an OLED, the light-emitting layer included in each of the light-emitting elements with the respective colors is an organic light-emitting layer formed by, for example, vapor deposition.

A control circuit including the transistors TR each of which controls a respective one of the red light-emitting element 5R, the green light-emitting element 5G, and the blue light-emitting element 5B is provided in the thin film transistor layer 4 including the transistors TR corresponding to the red subpixel RSP, the green subpixel GSP, and the blue subpixel BSP. Note that the control circuit including the transistors TR provided corresponding to the red subpixel RSP, the green subpixel GSP, and the blue subpixel BSP and the light-emitting elements are collectively referred to as a subpixel circuit.

The red light-emitting element 5R, the green light-emitting element 5G, and the blue light-emitting element 5B illustrated in FIG. 2 may be a top-emitting type or a bottom emission type. Since each of the red light-emitting element 5R, the green light-emitting element 5G, and the blue light-emitting element 5B has a regular layered structure in which the anode 22, the function layer 24R, 24G, or 24B, and the cathode 25 are formed in this order from the substrate 12 side, the cathode 25 is disposed as an upper layer over the anode 22. In the present embodiment, in order to form the top-emitting type, the anode 22 is formed by using an electrode structure (for example, indium tin oxide (ITO)/Ag/indium tin oxide (ITO)) that can reflect visible light, and the cathode 25 is formed by using an electrode material (for example, AgNW) that can transmit visible light.

In the present embodiment, as described above, the red light-emitting element 5R, the green light-emitting element 5G, and the blue light-emitting element 5B are QLEDs (quantum dot light-emitting diodes), and a quantum dot included in the light-emitting layer of each color includes a ligand made of an organic material. Thus, in order not to thermally damage the ligand including the organic material by a heat treatment in a step of forming a hole injection layer including a Nickel Oxide (NiO) nanoparticle and dimethyl sulfoxide (DMSO) that chemically modifies the NiO nanoparticle, which will be described later, it is preferable to form the red light-emitting element 5R, the green light-emitting element 5G, and the blue light-emitting element 5B in the regular layered structure by forming the hole injection layer on a side closer to the substrate 12 than the light-emitting layer of each color, that is, by forming the hole injection layer before forming the light-emitting layer of each color. Further, when the red light-emitting element 5R, the green light-emitting element 5G, and the blue light-emitting element 5B are OLEDs (organic light-emitting diodes) and the light-emitting layers of the respective colors are organic light-emitting layers formed by vapor deposition, it is also preferable to form the red light-emitting element 5R, the green light-emitting element 5G, and the blue light-emitting element 5B in the regular layered structure by forming the hole injection layer on a side closer to the substrate 12 than the organic light-emitting layer of each color, that is, by forming the hole injection layer before forming the organic light-emitting layer of each color so that the organic light-emitting layers of the respective colors are not thermally damaged by the heat treatment in the step of forming the hole injection layer including the NiO nanoparticle and DMSO that chemically modifies the NiO nanoparticle, which will be described later. On the other hand, when the red light-emitting element 5R, the green light-emitting element 5G, and the blue light-emitting element 5B are QLEDs (quantum dot light-emitting diodes) and the quantum dots included in the light-emitting layers of the respective colors include ligands made of an inorganic material, the red light-emitting element 5R, the green light-emitting element 5G, and the blue light-emitting element 5B may have the regular layered structure or an inverted layered structure in which the cathode 25, the function layer 24R, 24G, or 24B, and the anode 22 are formed in this order from the substrate 12 side. In the inverted layered structure, the light-emitting layer of each color is formed on the side closer to the substrate 12 than the hole injection layer including the NiO nanoparticle and DMSO that chemically modifies the NiO nanoparticle, that is, the light-emitting layer of each color is formed before forming the hole injection layer. In the case of such inverted layered structure, since the anode 22 is disposed as an upper layer than the cathode 25, the cathode 25 is formed by an electrode structure (for example, ITO/Ag/ITO) that can reflect visible light, and the anode 22 is formed by an electrode material that transmits visible light in order to obtain the top-emitting type.

The electrode material that reflects visible light is not particularly limited as long as the material can reflect visible light and has electrical conductivity. Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), or a layered body of the alloys and the transparent metal oxides.

On the other hand, the electrode material that transmits visible light is not particularly limited as long as the material can transmit visible light and has electrical conductivity. Examples include a thin film formed of a transparent metal oxide (for example, indium tin oxide, indium zinc oxide, indium gallium zinc oxide, and the like) or a metal material such as Al and Ag, or a nano wire formed of a metal material such as Al and Ag.

A typical electrode forming method can be used as the method of forming the anode 22 and the cathode 25, and examples thereof include physical vapor deposition (PVD) such as vacuum vapor deposition, a sputtering method, electron beam (EB) vapor deposition, and an ion plating method, or chemical vapor deposition (CVD). Further, the method of patterning the anode 22 and the cathode 25 is not particularly limited as long as the method is capable of precisely forming a desired pattern, and specific examples include a photolithography method and an ink-jet method.

The sealing layer 6 is a transparent film and, for example, may be formed of an inorganic sealing film 26 covering the cathode 25, an organic film 27 serving as an upper layer overlying the inorganic sealing film 26, and an inorganic sealing film 28 serving as an upper layer overlying the organic film 27. The sealing layer 6 inhibits foreign matters such as water and oxygen from penetrating into the red light-emitting element 5R, the green light-emitting element 5G, and the blue light-emitting element 5B.

The inorganic sealing film 26 and the inorganic sealing film 28 are both inorganic films and may be formed of, for example, a silicon oxide film, a silicon nitride film, a silicon oxynitride film, or a layered film thereof, formed by CVD. The organic film 27 is a transparent organic film having a flattening effect, and may be formed of a coatable organic material such as acrylic, for example. The organic film 27 may be formed by an ink-jet method, for example. The case has been described as an example of the present embodiment in which the sealing layer 6 is formed of two layers of an inorganic film and one layer of an organic film provided between the two layers of the inorganic film. However, the layering order of the two layers of the inorganic film and the one layer of the organic film is not limited thereto. Further, the sealing layer 6 may be formed of only an inorganic film, may be formed of only an organic film, may be formed of one layer of an inorganic film and two layers of an organic film, or may be formed of two or more layers of an inorganic film and two or more layers of an organic film.

The function film 39 is a film with at least one of an optical compensation function, a touch sensor function, or a protection function, for example.

Figure 3:
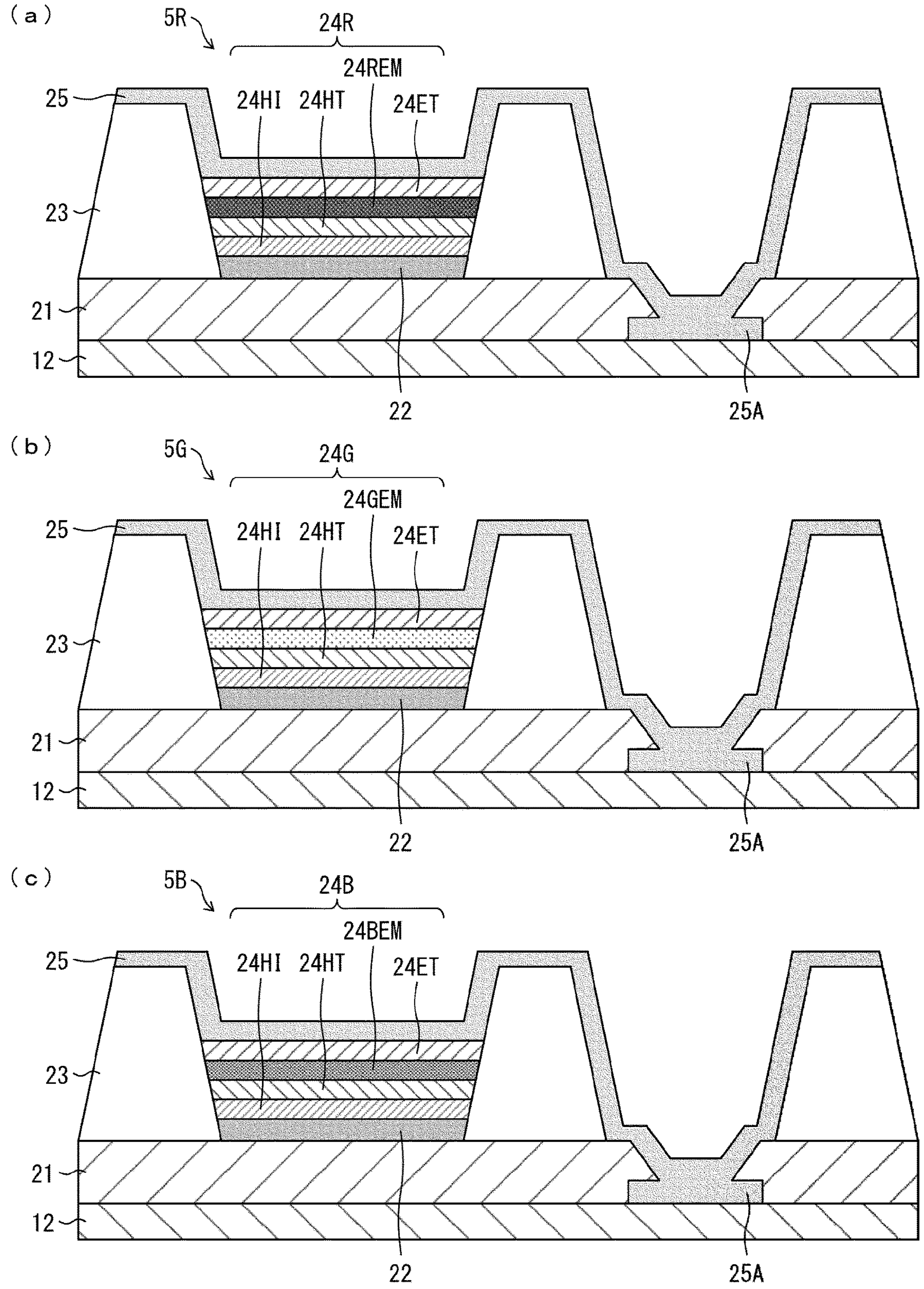
FIG. 3(*a*) is a cross-sectional view illustrating a schematic configuration of a red light-emitting element provided in the display device according to the first embodiment, FIG. 3(*b*) is a cross-sectional view illustrating a schematic configuration of a green light-emitting element provided in the display device according to the first embodiment, and FIG. 3(*c*) is a cross-sectional view illustrating a schematic configuration of a blue light-emitting element provided in the display device according to the first embodiment.

(a) of FIG. 3 is a cross-sectional view illustrating a schematic configuration of the red light-emitting element 5R included in the display device 1, (b) of FIG. 3 is a cross-sectional view illustrating a schematic configuration of the green light-emitting element 5G included in the display device 1, and (c) of FIG. 3 is a cross-sectional view illustrating a schematic configuration of the blue light-emitting element 5B included in the display device 1.

The red light-emitting element 5R illustrated in (a) of FIG. 3 is formed by layering the anode 22, the function layer 24R including a red light-emitting layer 24REM (first light-emitting layer), and the cathode 25 in this order from the substrate 12 (illustrated in FIG. 2) side. In the present embodiment, a case will be described, as an example, where the function layer 24R including the red light-emitting layer 24REM (first light-emitting layer) is formed by layering a hole injection layer 24HI including a NiO nanoparticle and DMSO that chemically modifies the NiO nanoparticle, a hole transport layer 24HT, the red light-emitting layer 24REM, and an electron transport layer 24ET in this order from the anode 22 side, but no such limitation is intended. Note that when the hole injection layer 24HI includes the NiO nanoparticle and DMSO that chemically modifies the NiO nanoparticle, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)] (TFB). In the present embodiment, an example will be described where TFB is used as the hole transport layer 24HT. In addition, as long as the function layer 24R including the red light-emitting layer 24REM includes a layer including a NiO nanoparticle and DMSO that chemically modifies the NiO nanoparticle between the anode 22 and the red light-emitting layer 24REM, for example, only the hole injection layer 24HI including the NiO nanoparticle and DMSO that chemically modifies the NiO nanoparticle may be provided between the anode 22 and the red light-emitting layer 24REM, only a hole transport layer including a NiO nanoparticle and DMSO that chemically modifies the NiO nanoparticle may be provided between the anode 22 and the red light-emitting layer 24REM, a hole injection layer made of a material different from a NiO nanoparticle and DMSO that chemically modifies the NiO nanoparticle and a hole transport layer including a NiO nanoparticle and DMSO that chemically modifies the NiO nanoparticle may be provided between the anode 22 and the red light-emitting layer 24REM, or a hole injection layer/hole transport layer including a NiO nanoparticle and DMSO that chemically modifies the NiO nanoparticle and having both functions of a hole injection layer and a hole transport layer may be provided between the anode 22 and the red light-emitting layer 24REM. Further, the function layer 24R including the red light-emitting layer 24REM may include an electron injection layer instead of the electron transport layer 24ET. Furthermore, an electron injection layer may be provided between the electron transport layer 24ET of the function layer 24R including the red light-emitting layer 24REM and the cathode 25. The cathode 25 is connected to a cathode auxiliary electrode 25A.

The green light-emitting element 5G illustrated in (b) of FIG. 3 is formed by layering the anode 22, the function layer 24G including a green light-emitting layer 24GEM (second light-emitting layer), and the cathode 25 in this order from the substrate 12 (illustrated in FIG. 2) side. In the present embodiment, a case will be described, as an example, in which the function layer 24G including the green light-emitting layer 24GEM is formed by layering the hole injection layer 24HI including the NiO nanoparticle and DMSO that chemically modifies the NiO nanoparticle, the hole transport layer 24HT, the green light-emitting layer 24GEM, and the electron transport layer 24ET in this order from the anode 22 side. However, no such limitation is intended. Note that when the hole injection layer 24HI includes the NiO nanoparticle and DMSO that chemically modifies the NiO nanoparticle, examples of the hole transport layer 24HT include polyvinyl carbazole (PVK) or poly[(9,9-dioctylfluorenyl-2,7-diyl)-co-(4,4'-(N-(4-sec-butylphenyl))diphenylamine)] (TFB). In the present embodiment, an example will be described where TFB is used as the hole transport layer 24HT. Additionally, as long as the function layer 24G including the green light-emitting layer 24GEM includes a layer including a NiO nanoparticle and DMSO that chemically modifies the NiO nanoparticle between the anode 22 and the green light-emitting layer 24GEM, for example, only the hole injection layer 24HI including the NiO nanoparticle and DMSO that chemically modifies the NiO nanoparticle may be provided between the anode 22 and the green light-emitting layer 24GEM, only a hole transport layer including a NiO nanoparticle and DMSO that chemically modifies the NiO nanoparticle may be provided between the anode 22 and the green light-emitting layer 24GEM, a hole injection layer made of a material different from a NiO nanoparticle and DMSO that chemically modifies the NiO nanoparticle and a hole transport layer including a NiO nanoparticle and DMSO that chemically modifies the NiO nanoparticle may be provided between the anode 22 and the green light-emitting layer 24GEM, or a hole injection layer/hole transport layer including a NiO nanoparticle and DMSO that chemically modifies the NiO nanoparticle and having both functions of a hole injection layer and a hole transport layer may be provided between the anode 22 and the green light-emitting layer 24GEM. In addition, the function layer 24G including the green light-emitting layer 24GEM may include an electron injection layer instead of the electron transport layer 24ET. Further, an electron injection layer may be provided between the electron transport layer 24ET of the function layer 24G including the green light-emitting layer 24GEM and the cathode 25. The cathode 25 is connected to the cathode auxiliary electrode 25A.

The blue light-emitting element 5B illustrated in (c) of FIG. 3 is formed by layering the anode 22, the function layer 24B including a blue light-emitting layer 24BEM (third light-emitting layer), and the cathode 25 in this order from the substrate 12 (illustrated in FIG. 2) side. In the present embodiment, a case will be described, as an example, in which the function layer 24B including the blue light-emitting layer 24BEM is formed by layering the hole injection layer 24HI including the NiO nanoparticle and DMSO that chemically modifies the NiO nanoparticle, the hole transport layer 24HT, the blue light-emitting layer 24BEM, and the electron transport layer 24ET in this order from the anode 22 side. However, no such limitation is intended. Note that when the hole injection layer 24HI includes the NiO nanoparticle and DMSO that chemically modifies the NiO nanoparticle, examples of the hole transport layer 24HT include polyvinyl carbazole (PVK), poly [(9,9-dioctylfluorenyl-2,7-diyl)-co-(4,4'-(N-(4-sec-butylphenyl))diphenylamine)] (TFB), or poly-TPD. In the present embodiment, an example will be described where TFB is used as the hole transport layer 24HT. Additionally, as long as the function layer 24B including the blue light-emitting layer 24BEM includes a layer including a NiO nanoparticle and DMSO that chemically modifies the NiO nanoparticle between the anode 22 and the blue light-emitting layer 24BEM, for example, only the hole injection layer 24HI including the NiO nanoparticle and DMSO that chemically modifies the NiO nanoparticle may be provided between the anode 22 and the blue light-emitting layer 24BEM, only a hole transport layer including a NiO nanoparticle and DMSO that chemically modifies the NiO nanoparticle may be provided between the anode 22 and the blue light-emitting layer 24BEM, a hole injection layer made of a material different from a NiO nanoparticle and DMSO that chemically modifies the NiO nanoparticle and a hole transport layer including a NiO nanoparticle and DMSO that chemically modifies the NiO nanoparticle may be provided between the anode 22 and the blue light-emitting layer 24BEM, or a hole injection layer/hole transport layer including a NiO nanoparticle and DMSO that chemically modifies the NiO nanoparticle and having both functions of a hole injection layer and a hole transport layer may be provided between the anode 22 and the blue light-emitting layer 24BEM. Further, the function layer 24B including the blue light-emitting layer 24BEM may include an electron injection layer instead of the electron transport layer 24ET. Further, an electron injection layer may be provided between the electron transport layer 24ET of the function layer 24B including the blue light-emitting layer 24BEM and the cathode 25. The cathode 25 is connected to the cathode auxiliary electrode 25A.

As described above, the hole injection layer 24HI includes the NiO nanoparticle that is an inorganic material and DMSO that chemically modifies the NiO nanoparticle.

Figure 4:
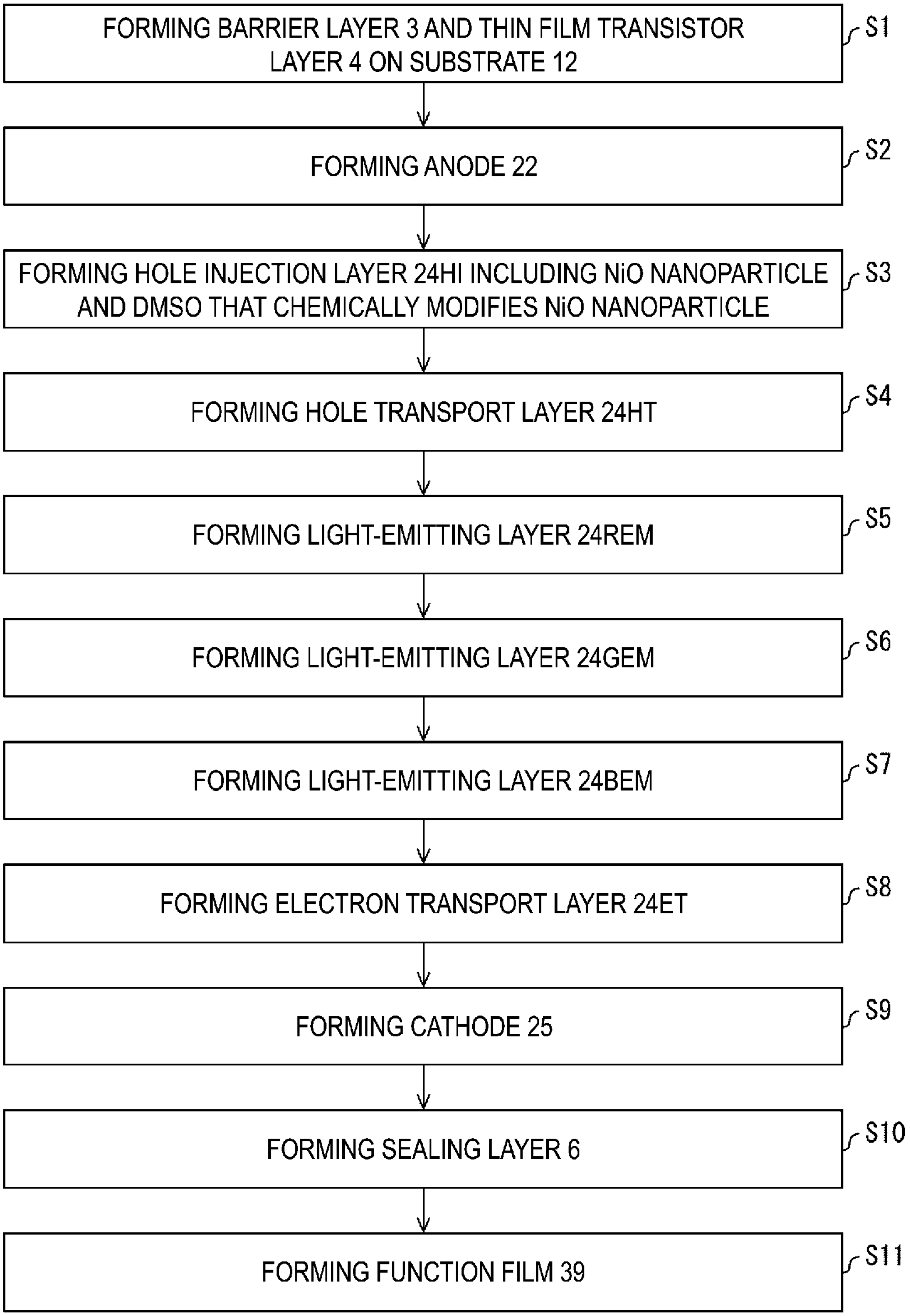
FIG. 4 is a diagram illustrating a process of manufacturing the display device according to the first embodiment.

FIG. 4 is a diagram illustrating a process of manufacturing the display device 1.

As illustrated in FIG. 4, the process of manufacturing the display device 1 includes a step (S1) of forming the barrier layer 3 and the thin film transistor layer 4 on the substrate 12, a step (S2) of forming the anode 22, a step (S3) of forming the hole injection layer 24HI including a NiO nanoparticle and DMSO that chemically modifies the NiO nanoparticle, a step (S4) of forming the hole transport layer 24HT, a step (S5) of forming the red light-emitting layer 24REM, a step (S6) of forming the green light-emitting layer 24GEM, a step (S7) of forming the blue light-emitting layer 24BEM, a step (S8) of forming the electron transport layer 24ET, a step (S9) of forming the cathode 25, a step (S10) of forming the sealing layer 6, and a step (S11) of forming the function film 39. The steps from the step (S2) of forming the anode 22 to the step (S9) of forming the cathode 25 are steps of forming the light-emitting elements 5R, 5G, and 5B on the thin film transistor layer 4. The step of forming the light-emitting elements 5R, 5G, and 5B includes a step of forming a layer including a NiO nanoparticle and DMSO that chemically modifies the NiO nanoparticle between the anode 22 and each of the light-emitting layers 24REM, 24GEM, and 24BEM of the respective colors, like the step (S3) of forming the hole injection layer 24HI including the NiO nanoparticle and DMSO that chemically modifies the NiO nanoparticle.

Although not illustrated, in the present embodiment, a step of forming the edge cover 23 that has insulating properties and that covers the edge of the anode 22 is included between the step (S2) of forming the anode 22 and the step (S3) of forming the hole injection layer 24HI including the NiO nanoparticle and DMSO that chemically modifies the NiO nanoparticle, but no such limitation is intended.

Additionally, as illustrated in FIG. 4, in the present embodiment, the step (S5) of forming the red light-emitting layer 24REM, the step (S6) of forming the green light-emitting layer 24GEM, and the step (S7) of forming the blue light-emitting layer 24BEM are performed in this order. In the step (S5) of forming the red light-emitting layer 24REM, as illustrated in (a) of FIG. 3, the red light-emitting layer 24REM included in the red light-emitting element 5R is formed in a predetermined shape. In the step (S6) of forming the green light-emitting layer 24GEM, as illustrated in (b) of FIG. 3, the green light-emitting layer 24GEM included in the green light-emitting element 5G is formed in a predetermined shape. In the step (S7) of forming the blue light-emitting layer 24BEM, as illustrated in (c) of FIG. 3, the blue light-emitting layer 24BEM included in the blue light-emitting element 5B is formed in a predetermined shape. Note that the order of performing the step (S5) of forming the red light-emitting layer 24REM, the step (S6) of forming the green light-emitting layer 24GEM, and the step (S7) of forming the blue light-emitting layer 24BEM is not particularly limited.

In the present embodiment, in the step (S3) of forming the hole injection layer 24HI including the NiO nanoparticle and DMSO that chemically modifies the NiO nanoparticle, a case where the hole injection layer 24HI including the NiO nanoparticle and DMSO that chemically modifies the NiO nanoparticle is formed as a common hole injection layer in the red light-emitting element 5R, the green light-emitting element 5G, and the blue light-emitting element 5B is described as an example, as illustrated in (a) of FIG. 3, (b) of FIG. 3, and (c) of FIG. 3, but no such limitation is intended. The hole injection layer 24HI including the NiO nanoparticle and DMSO that chemically modifies the NiO nanoparticle may be formed as a hole injection layer in at least one of the red light-emitting element 5R, the green light-emitting element 5G, and the blue light-emitting element 5B.

In the present embodiment, in the step (S4) of forming the hole transport layer 24HT, as illustrated in (a) of FIG. 3, (b) of FIG. 3, and (c) of FIG. 3, a case where the hole transport layer 24HT is formed as a common hole transport layer in the red light-emitting element 5R, the green light-emitting element 5G, and the blue light-emitting element 5B is described as an example, but no such limitation is limited. The hole transport layer 24HT may be formed as a hole transport layer in at least one of the red light-emitting element 5R, the green light-emitting element 5G, and the blue light-emitting element 5B.

In the present embodiment, in the step (S8) of forming the electron transport layer 24ET, as illustrated in (a) of FIG. 3, (b) of FIG. 3, and (c) of FIG. 3, a case where the electron transport layer 24ET is formed as a common electron transport layer in the red light-emitting element 5R, the green light-emitting element 5G, and the blue light-emitting element 5B is described as an example, but no such limitation is limited. The electron transport layer 24ET may be formed as an electron transport layer in at least one of the red light-emitting element 5R, the green light-emitting element 5G, and the blue light-emitting element 5B.

Figure 5:
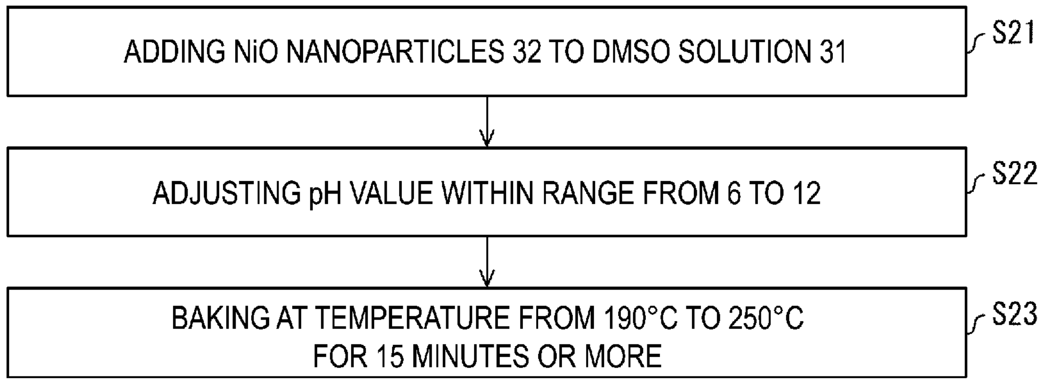
FIG. 5 is a diagram illustrating an example of a step of forming a hole injection layer including NiO nanoparticles and DMSO that chemically modifies the NiO nanoparticles in the process of manufacturing the display device according to the first embodiment illustrated in FIG. 4.
Figure 6:
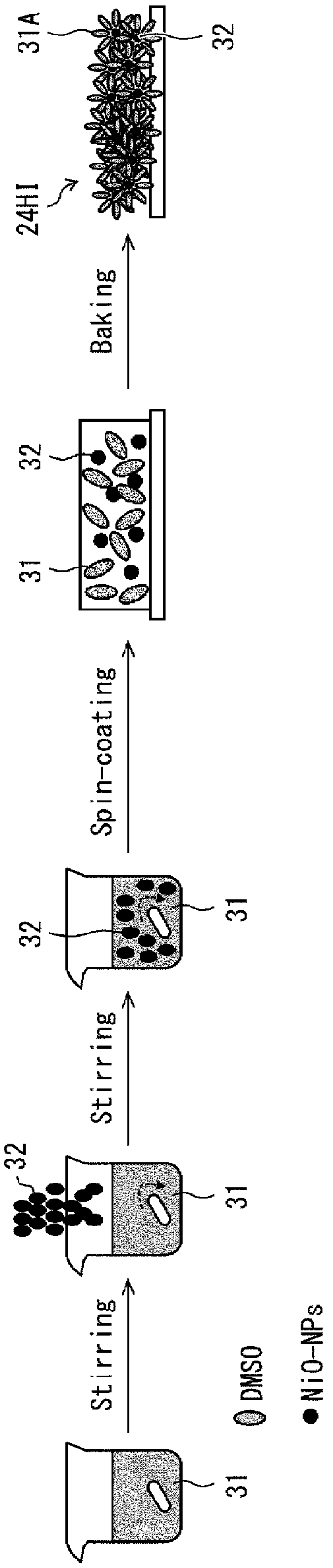
FIG. 6 is a schematic view for describing the step of forming the hole injection layer.

FIG. 5 is a diagram illustrating an example of a step of forming the hole injection layer 24HI including the NiO nanoparticle and DMSO that chemically modifies the NiO nanoparticle in the process of manufacturing the display device 1 illustrated in FIG. 4. FIG. 6 is a schematic view for describing a step of forming the hole injection layer 24HI including NiO nanoparticles 32 and DMSO 31A that chemically modifies the NiO nanoparticles 32.

The step (S3) of forming the hole injection layer 24HI including the NiO nanoparticles 32 and the DMSO 31A that chemically modifies the NiO nanoparticles 32 in the process of manufacturing the display device 1 illustrated in FIG. 4 includes a step (S21) of adding the NiO nanoparticles 32 to a DMSO solution 31, a step (S22) of adjusting a pH value within a range from 6 to 12, and a step (S23) of baking at a temperature from 190° C. to 250° C. for 15 minutes or more.

The DMSO solution is a bulk state dimethyl sulfoxide dispersion solution with respect to a solute, and means DMSO in a liquid state.

The DMSO solution 31 may be a mixed solvent of the DMSO 31A and water.

First, while the DMSO solution 31 is being stirred, the NiO nanoparticles 32 are added to the DMSO solution 31 so that a concentration thereof becomes from 1 to 20 mg/ml. Thereafter, when the DMSO solution 31 is stirred for 30 minutes or more, a floating substance in the DMSO solution 31 disappears. Then, the DMSO solution 31 is filtered by using a 0.45 μm filter.

Next, ethanolamine, diethylamine, or the like is added to the DMSO solution 31 to adjust the pH value within the range from 6 to 12.0. Accordingly, a zeta potential is preferably within a range from −5 to −35 m V.

Thereafter, it is preferable that the DMSO solution 31 be spin-coated and baked at a temperature from 190° C. to 250° C. for 15 minutes or more. Then, a DMSO—NiO-NPs crystal film (the hole injection layer 24HI) where the DMSO 31A chemically modifies the NiO nanoparticles 32 (modification) is generated.

Figure 7:
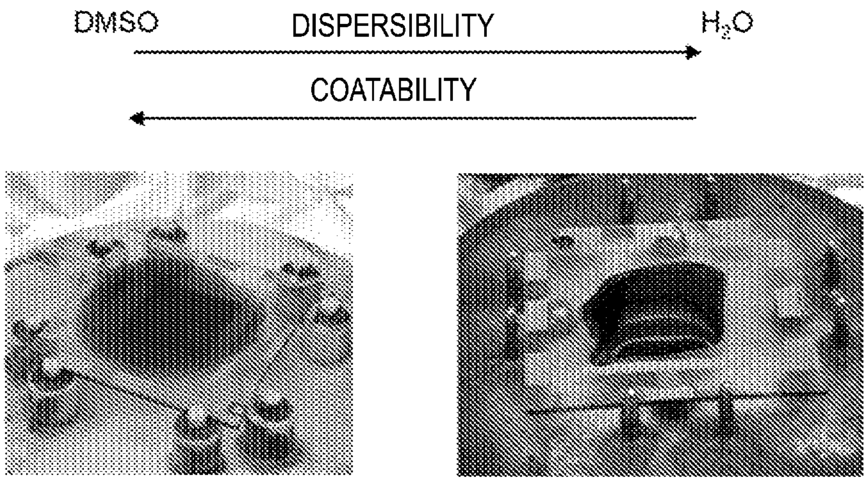
FIG. 7 is a schematic view for describing dispersibility and coatability of the hole injection layer.

FIG. 7 is a schematic view for describing dispersibility and coatability of the hole injection layer 24HI.

A known composition that is for forming a hole injection layer and that is obtained by dispersing NiO nanoparticles in water is repelled by a general water-repellent bank (edge cover 23) due to water dispersion, and uniform application for forming a hole injection layer is difficult, which is very problematic. The film thickness unevenness due to the difficulty in uniform coating is considered to be one of the factors that affect the EL Electro-Luminescence (EL) performance of a light-emitting element.

On the other hand, since the hole injection layer 24HI including the NiO nanoparticle and DMSO that chemically modifies the NiO nanoparticle according to the present embodiment is formed by the DMSO solution in which the NiO nanoparticles are dispersed, the coatability on the water-repellent bank is improved.

Figure 8:
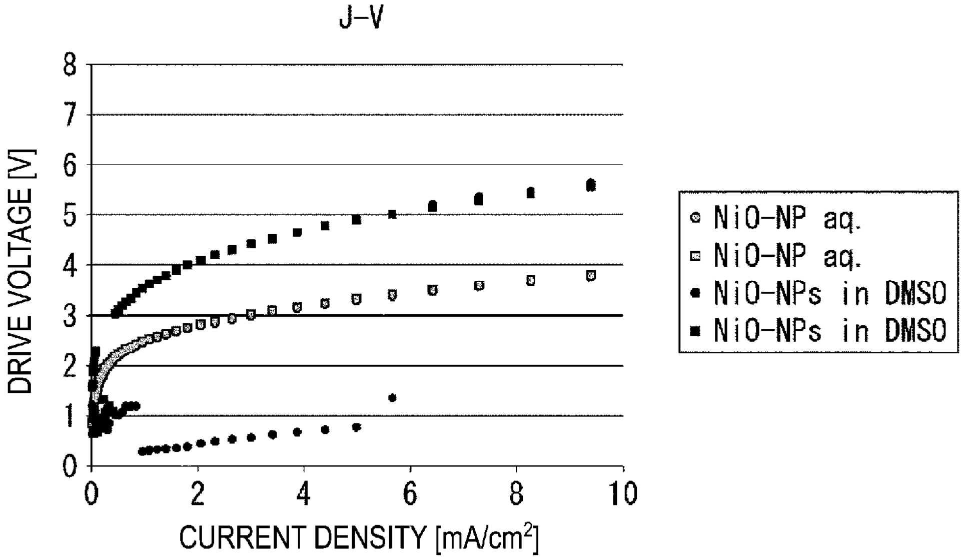
FIG. 8 is a graph illustrating relationships between drive voltages and current densities of the hole injection layer.
Figure 9:
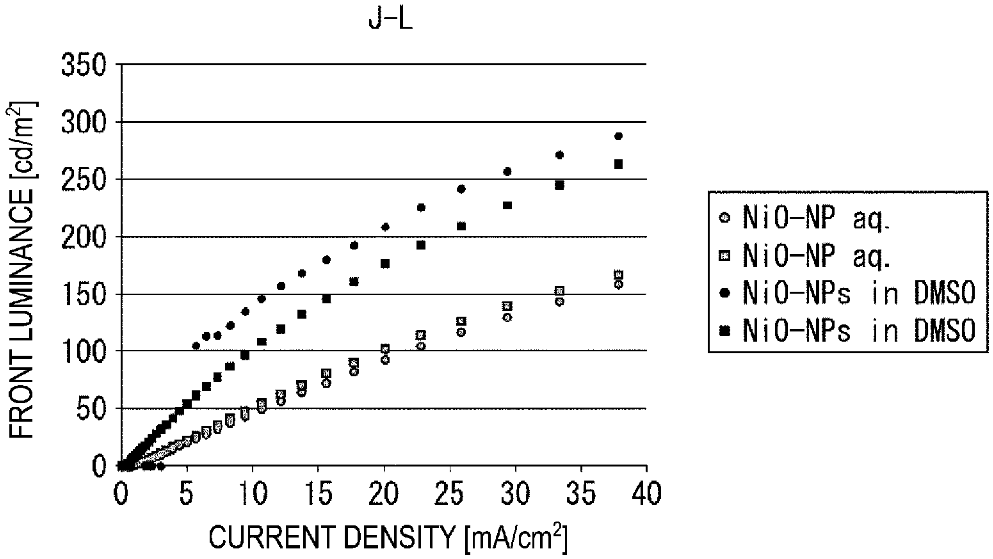
FIG. 9 is a graph illustrating relationships between current densities and luminances of the hole injection layer.
Figure 10:
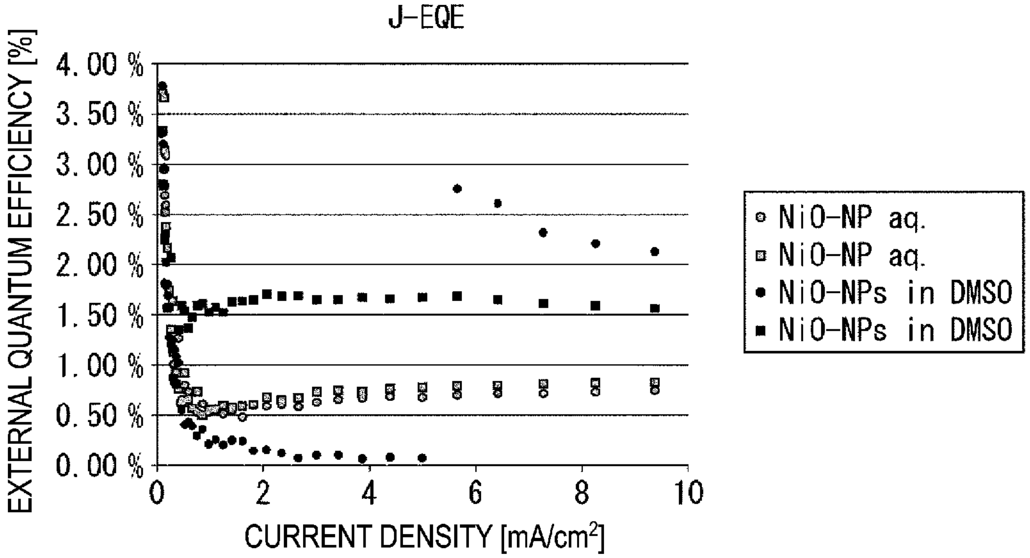
FIG. 10 is a graph illustrating relationships between current densities and external quantum efficiencies of the hole injection layer.

FIG. 8 is a graph illustrating relationships between drive voltages and current densities of a QLED according to the hole injection layer 24HI. FIG. 9 is a graph illustrating relationships between current densities and luminances of the QLED according to the hole injection layer 24HI. FIG. 10 is a graph illustrating relationships between current densities and external quantum efficiencies of the QLED according to the hole injection layer 24HI.

The QLED has a configuration of Anode/HIL (NiO-NPs)/HTL (Poly-TPD)/EML (InP/ZnSe (G))/ETL (MgZnO)/Cathode.

As compared with a known light-emitting element including a hole injection layer including a water-dispersible NiO nanoparticle, the light-emitting element including the hole injection layer 24HI including the NiO nanoparticle and DMSO that chemically modifies the NiO nanoparticle according to the present embodiment slightly improves a drive voltage, which improves a front luminance twice and improves an external quantum efficiency (EQE) about 1.5 times.

A light-emitting element according to a comparative example uses a NiO nanoparticle as an inorganic hole injection layer in order to improve reliability of a QLED, which improves the reliability thereof but makes a luminous efficiency thereof low.

On the other hand, in order to maintain the reliability of the QLED element itself, the hole injection layers 24HI according to the red light-emitting element 5R, the green light-emitting element 5G, and the blue light-emitting element 5B (first to third light-emitting elements) according to the embodiments use NiO nanoparticles (NiO-NPs) having crystallinity, and modify the NiO nanoparticles with DMSO (modification) to act as an acceptor-type dopant, which improves the p-type hole transport capability of the NiO nanoparticles and successfully improves the luminous efficiency of the EL device.

Whether or not DMSO chemically modifies a NiO nanoparticle can be confirmed by detecting a bond state by, for example, X-ray photoelectron spectroscopy (XPS) or by observing a crystal structure.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
- a substrate;
- a thin film transistor layer provided on the substrate; and
- a plurality of light-emitting elements provided on the thin film transistor layer,
- wherein the plurality of light-emitting elements include:
  - an anode;
  - a cathode;
  - a light-emitting layer provided between the anode and the cathode; and
  - a hole injection layer provided between the anode and the light-emitting layer, wherein the hole injection layer includes a nickel oxide nanoparticle and dimethyl sulfoxide that chemically modifies the nickel oxide nanoparticle,
- the plurality of light-emitting elements include a first light-emitting element, a second light-emitting element, and a third light-emitting element,
- the first light-emitting element includes, as the light-emitting layer, a first light-emitting layer,
- the second light-emitting element includes, as the light-emitting layer, a second light-emitting layer having a light-emission peak wavelength different from a light-emission peak wavelength of the first light-emitting layer, and the third light-emitting element includes, as the light-emitting layer, a third light-emitting layer having a light-emission peak wavelength different from the light-emission peak wavelengths of the first light-emitting layer and the second light-emitting layer.

2. The display device according to claim 1, wherein;

the plurality of light-emitting elements further comprises: a hole transport layer provided between the hole injection layer and the light-emitting layer, and the hole transport layer includes a material similar to a material of the hole injection layer.

3. The display device according to claim 1, wherein;

each of the first light-emitting layer, the second light-emitting layer, and the third light-emitting layer includes a quantum dot, and in each of the first light-emitting element, the second light-emitting element, and the third light-emitting element, the anode is provided on a side closer to the substrate than the cathode is, and the hole injection layer is provided on the side closer to the substrate than the light-emitting layer is.

4. A method of manufacturing a display device, the method comprising:

forming a thin film transistor layer on a substrate; and forming a light-emitting element on the thin film transistor layer, the light-emitting element including an anode, a cathode, and a light-emitting layer provided between the anode and the cathode, wherein forming the light-emitting element includes forming a hole injection layer, including a nickel oxide nanoparticle and dimethyl sulfoxide that chemically modifies the nickel oxide nanoparticle, between the anode and the light-emitting layer, and forming the hole injection layer includes;

adding the nickel oxide nanoparticle to a dimethyl sulfoxide solution, adding ethanolamine or diethylamine to the dimethyl sulfoxide solution with the added nickel oxide nanoparticle to adjust a pH value within a range from 6 to 12, both inclusive, and spin-coating, on the anode, the dimethyl sulfoxide solution obtained by adjusting the pH value, and baking the spin-coated dimethyl sulfoxide solution at a temperature within a range from 190° C. to 250° C., both inclusive, to form the hole injection layer.

5. The method according to claim 4, wherein forming the light-emitting element further includes forming a hole transport layer between the hole injection layer and the light-emitting layer.

6. The method according to claim 4, wherein the dimethyl sulfoxide solution is a mixed solvent of the dimethyl sulfoxide and water.

7. The display device according to claim 1, wherein:

the plurality of light-emitting elements further comprises a hole transport layer provided between the hole injection layer and the light-emitting layer, and the hole transport layer is formed of polyvinyl carbazole (PVK) or poly[(9,9-dioctylfluorenyl-2,7-diyl)-co-(4,4'-(N-(4-sec-butylphenyl))diphenylamine)] (TFB).

* * * * *